United States Patent
Kim et al.

(10) Patent No.: US 8,421,348 B2
(45) Date of Patent: Apr. 16, 2013

(54) ORGANIC LIGHT EMITTING DIODE DISPLAY DEVICE AND METHOD OF FABRICATING THE SAME

(75) Inventors: Sung-Hee Kim, Seoul (KR); Gee-Sung Chae, Incheon (KR); Mi-Kyung Park, Anyang (KR)

(73) Assignee: LG Display Co., Ltd., Seoul (KR)

( * ) Notice: Subject to any disclaimer, the term of this patent is extended or adjusted under 35 U.S.C. 154(b) by 747 days.

(21) Appl. No.: 11/963,626

(22) Filed: Dec. 21, 2007

(65) Prior Publication Data
US 2008/0150423 A1      Jun. 26, 2008

(30) Foreign Application Priority Data
Dec. 22, 2006  (KR) .......... 10-2006-0133124

(51) Int. Cl.
*H01J 1/62* (2006.01)
*H01J 63/04* (2006.01)
(52) U.S. Cl.
USPC ........... 313/506; 313/500; 313/503; 313/504; 313/509; 445/23; 445/24
(58) Field of Classification Search .......... 313/504, 313/506, 500, 503, 509; 445/24, 23
See application file for complete search history.

(56) References Cited

U.S. PATENT DOCUMENTS

| | | | | |
|---|---|---|---|---|
| 6,660,379 B1 * | 12/2003 | Lakowicz et al. | ........ | 428/402 |
| 2002/0001026 A1 * | 1/2002 | Ishikawa et al. | ........ | 347/101 |
| 2003/0222267 A1 | 12/2003 | Kim et al. | | |
| 2003/0230967 A1 * | 12/2003 | Kawamura et al. | ........ | 313/483 |
| 2005/0001538 A1 * | 1/2005 | Ozkan et al. | ........ | 313/503 |
| 2005/0012099 A1 * | 1/2005 | Couillard et al. | ........ | 257/66 |
| 2005/0194896 A1 * | 9/2005 | Sugita et al. | ........ | 313/506 |
| 2006/0127563 A1 * | 6/2006 | Toyoda et al. | ........ | 427/58 |
| 2006/0208630 A1 * | 9/2006 | Roman et al. | ........ | 313/503 |
| 2007/0166855 A1 * | 7/2007 | Lee et al. | ........ | 438/29 |

FOREIGN PATENT DOCUMENTS

CN    1517727 A    8/2004

OTHER PUBLICATIONS

Office Action issued in corresponding Chinese Patent Application No. 200710300579.3; issued Dec. 25, 2009.

* cited by examiner

*Primary Examiner* — Nimeshkumar Patel
*Assistant Examiner* — Thomas A Hollweg
(74) *Attorney, Agent, or Firm* — Brinks Hofer Gilson & Lione

(57) ABSTRACT

An organic light emitting diode display device and a method of fabricating the same, the method comprising: forming a first electrode on a substrate; forming a hydrophilic partition wall having a plurality of openings on the first electrode; forming hydrophobic red, green and blue organic light emitting layers on the plurality of openings of the partition wall, respectively; and forming a second electrode on each of the hydrophobic red, green and blue organic light emitting layers, whereby thin films can be selectively formed by a surface treatment so as to improve color impurity at boundaries of red, green and blue patterns.

10 Claims, 5 Drawing Sheets

HYDROPHOBIC-
OCTADECYLTRICOROSILANE

ORGANIC LIGHT EMITTING DIODE DISPLAY DEVICE AND METHOD OF FABRICATING THE SAME

CLAIM OF PRIORITY

This application claims the benefit of Korean Patent Application No. 10-2006-0133124 filed on Dec. 22, 2006, which is hereby incorporated by reference for all purposes as if fully set forth herein.

BACKGROUND OF INVENTION

1. Field of Invention

The present invention relates to an organic light emitting diode display device and a method of fabricating the same, and particularly, to an organic light emitting diode display device capable of improving color purity at boundaries of red, green and blue patterns by selectively forming thin films through a surface treatment, and a method of fabricating the same.

2. Background of the Invention

Flat panel display devices, such as organic light emitting diode (OLED), plasma display panel (PDP) and liquid crystal display (LCD) are being developed to replace cathode ray tube (CRT) which is heavy in weight and large in size.

Among those display devices, for example, the LCD and the OLED are provided with pixels each including a switching device, and a signal line including gate lines and data lines. The LCD and the OLED also include color filters or organic light emitting layers instead of the color filter to display an image with various colors.

Recently, in order to form color filters or organic light emitting layers, many new processing methods are being used to replace a traditional photolithography. A representative one is an inkjet printing method.

The inkjet printing is a method in which a shielding member, such as a black matrix or the like, is disposed on an insulating substrate, openings corresponding to pixels are formed at the shielding member via an exposure process and a development process, and ink droplets for a color filter are dispensed in the openings.

The formation of the color filters by adapting the inkjet printing method does not require processes of coating, exposure, development and the like, which allows a reduction of materials required for each process and a simplification of the whole fabrication process.

However, the process of forming the shielding member, namely, a partition wall which is performed prior to applying the inkjet printing method having such advantages requires the exposure process and the development process depending on an existing photolithography technique.

An organic light emitting diode display device according to the related art having a partition wall formed by using the photolithography technique will be described as follows with reference to FIGS. 1 and 2.

FIG. 1 is a planar view of an organic light emitting diode display device fabricated by using an inkjet printing method according to the related art.

FIG. 2 is a cross-sectional view taken along the line II-II of FIG. 1, which schematically shows an organic light emitting diode display device according to the related art.

As shown in FIG. 1, the organic light emitting diode display device according to the related art may comprise a substrate 11, an anode electrode 13 disposed on the substrate 11, a partition wall 15a formed on the anode electrode 13 and having openings corresponding to the number of pixels, a plurality of red R, green G and blue B organic light emitting layers 23a, 23b and 23c formed on the openings of the partition wall 15a, and cathode electrodes 25 formed on the organic light emitting layers 23a, 23b and 23c.

Here, the partition wall 15a may improve brightness by blocking light leaked through a space between neighboring pixels, and may keep inks of color filters or organic light emitting layers during a fabrication process.

A fabrication method of the organic light emitting diode display device according to the related art having such configuration will be described with reference to FIGS. 3a to 3e.

FIGS. 3a to 3e are cross-sectional views showing fabrication processes of the related art organic light emitting diode display device.

As shown in FIG. 3a, first, a conductive material is deposited on a substrate 11 to form an anode electrode 13 of the organic light emitting diode display device.

An insulating layer 15 is deposited on the anode electrode 13 by a certain thickness, and then a photosensitive layer 17 is coated thereon.

Then, as shown in FIG. 3b, exposure and development processes are performed using a photolithography technique to selectively pattern the photosensitive layer 17, thereby forming photosensitive layer patterns 17a.

As shown in FIG. 3c, the insulating layer 15 is selectively removed by using the photosensitive layer patterns 17a as blocking layers, so as to obtain a partition wall 15a having openings where a plurality of organic light emitting layers are defined.

As shown in FIG. 3d, after removing the photosensitive layer patterns 17a, red R, green G and blue R organic light emitting solutions are sequentially dispensed into the openings of the partition wall 15a through inkjet dispensing units 19a, 19b and 19c by an inkjet printing method, so as to form R, G and B organic light emitting layers 23a, 23b and 23c, respectively.

Here, the inkjet dispensing units 19a, 19b and 19c may be used simultaneously or sequentially.

That is, a particular order is not required to dispense the R, G and B organic light emitting solutions, which means that any solution can be dropped first.

As shown in FIG. 3e, after forming the R, G and B organic light emitting layers 23a, 23b and 23c, a metallic material is deposited on the partition wall 15a having the organic light emitting layers 23a, 23b and 23c formed thereon.

The metallic layer is selectively patterned to form a cathode electrode 25 with respect to the anode electrode 12.

As mentioned above, several problems may occur in the organic light emitting diode display device and the fabrication method thereof according to the related art.

In the organic light emitting diode display device and the fabrication method thereof according to the related art, each organic light emitting solution for the color filters dispensed into the openings between the partition walls is a liquid crystal compound containing pigment, solvent, and other dispersing agents.

Accordingly, it is very difficult to dispense ink droplets on a desired point with a desired amount in a fluid state. Also, it is difficult to measure a misalignment, such as at which point ink droplets are dispensed far away from a desired drop point, based on the shape of the ink droplet in the opening.

In particular, since such dispensed ink droplet freely spreads out, it may be difficult to determine a point where ink droplet is mis-dispensed based on the spread shape of ink droplet.

As a result, the mis-dispensed ink may spread on the partition wall between neighboring organic light emitting layers, and additionally degrade the display characteristic of the display device.

Also, the time taken by drying each organic light emitting solution and the viscosity of each organic light emitting solution may be different. Such difference may cause non-uniformities of a thickness of an organic thin film at the same pattern and a degradation of color impurity.

Furthermore, the inkjet printing method may not be appropriate for forming fine patterns of several micrometers (μm), and should typically form partition walls for dividing each pattern in order to form desired thin films on a substrate. Also, the inkjet printing may additionally require a process of constructing a partition wall and a process of removing the partition wall.

Thus, due to the additionally required partition wall-forming process and the partition wall-removing process, the whole fabrication process may become more complicated, which increases fabrication cost.

SUMMARY

An organic light emitting diode display device comprises: a first electrode formed on a substrate; a partition wall having hydrophilicity and formed on the first electrode, the partition wall having a plurality of openings; red, green and blue organic light emitting layers having hydrophobicity and respectively formed in the plurality of openings of the partition wall; and a second electrode formed on each of the hydrophobic red, green and blue organic light emitting layers.

In one embodiment, there is provided a fabrication method for an organic light emitting diode display device comprising: forming a first electrode on a substrate; forming a hydrophilic partition wall on the first electrode, the partition wall having a plurality of openings; forming hydrophobic red, green and blue organic light emitting layers respectively in the plurality of openings of the partition wall; and forming a second electrode on each of the hydrophobic red, green and blue organic light emitting layers.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 6a and 6b are chemical formulas representing types of amine groups which form a partition wall of the organic light emitting diode display device according to the present disclosure, wherein FIG. 6a is a chemical formula of 3-aminopropyltrimethoxysilane, and FIG. 6b is a chemical formula of 3-aminopropyltriethoxysilane.

DETAILED DESCRIPTION OF THE DRAWINGS AND THE PRESENTLY PREFERRED EMBODIMENTS

Description will now be given in detail of an organic light emitting diode display device according to the present invention, with reference to the accompanying drawings.

Figure 1:
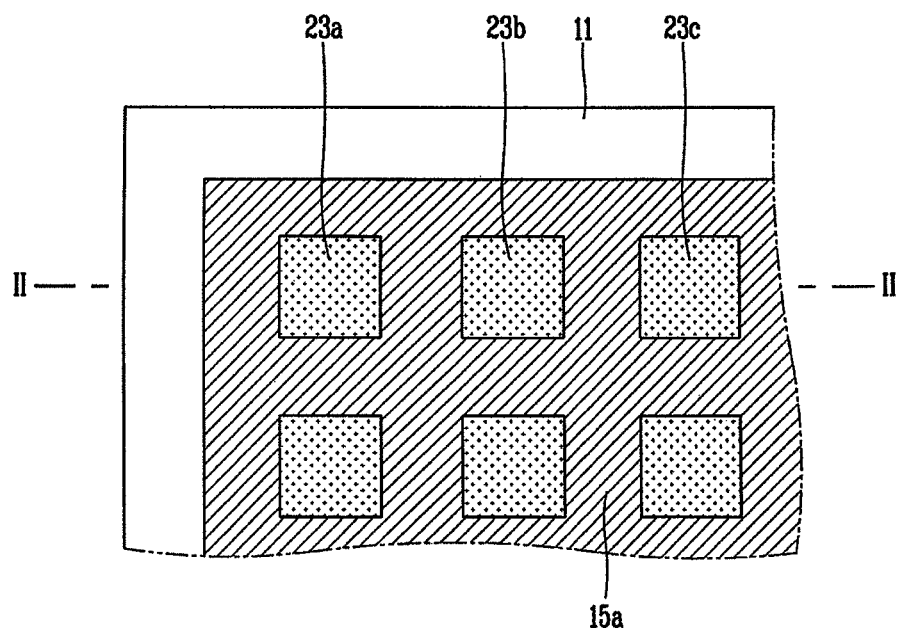
FIG. 1 is a planar view of a related art organic light emitting diode display device fabricated using an inkjet printing.
Figure 2:
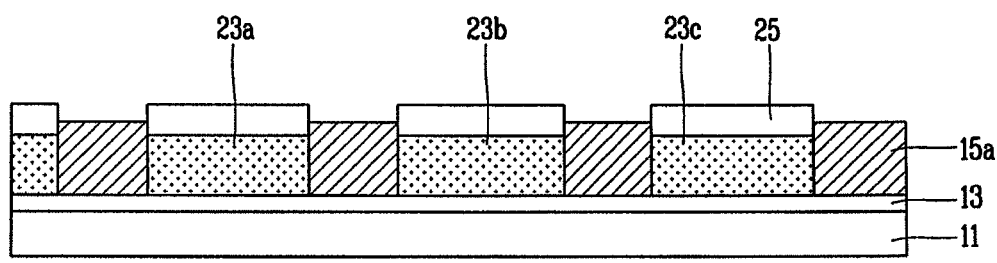
FIG. 2 is a cross-sectional view taken along the line II-II of FIG. 1, which schematically shows the organic light emitting diode display device according to the related art.
Figure 3A:
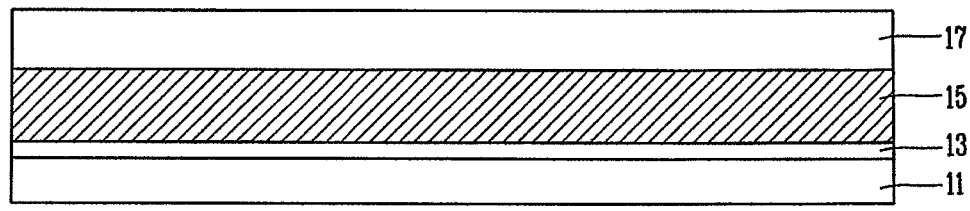
FIGS. 3a to 3e are cross-sectional views showing fabrication processes of the organic light emitting diode display device according to the related art.
Figure 3B:
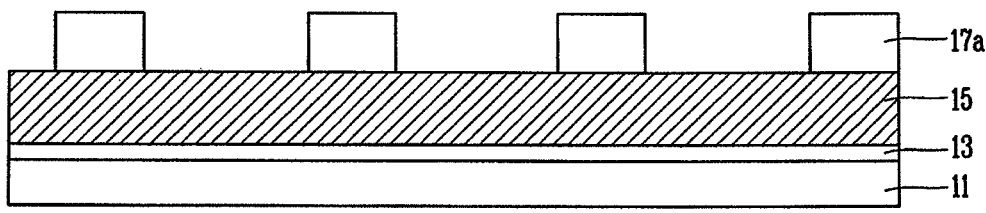
Figure 3C:
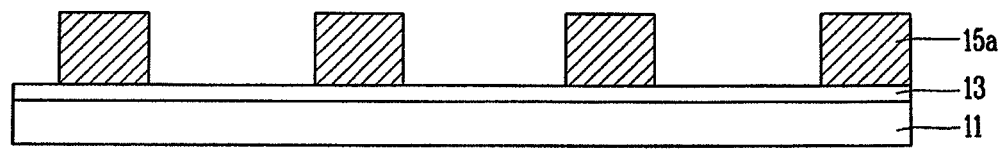
Figure 3D:
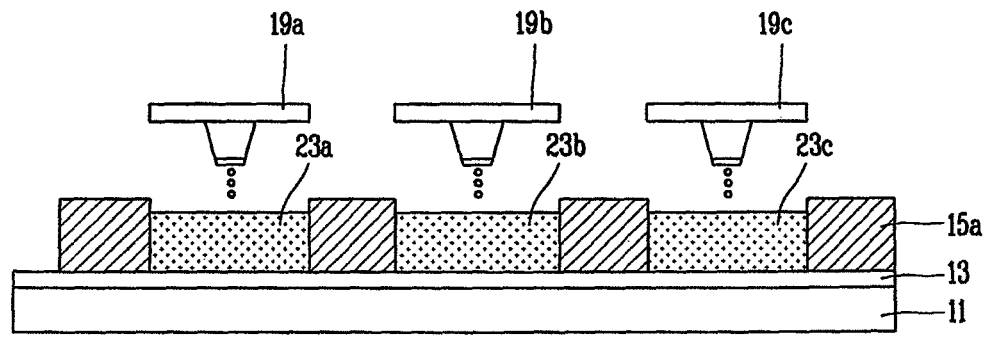
Figure 3E:
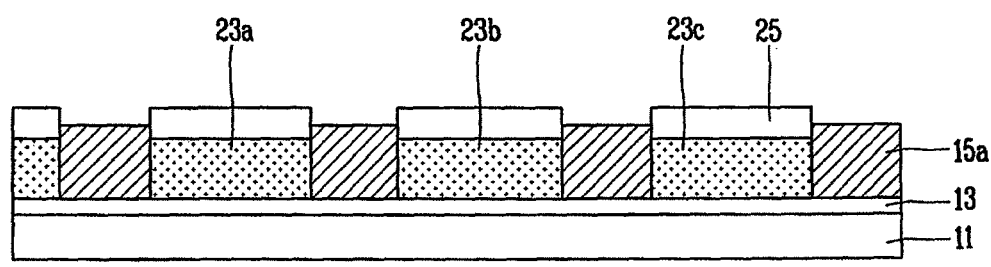
Figure 4:
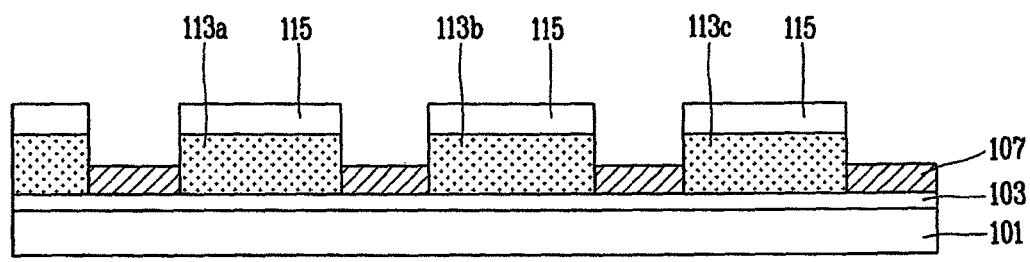
FIG. 4 is a cross-sectional view schematically showing an organic light emitting diode display device according to the present disclosure.

FIG. 4 is a cross-sectional view schematically showing an organic light emitting diode display device according to the present invention.

As shown in FIG. 4, the organic light emitting diode display device according to the present disclosure may comprise a substrate 101, a first electrode 103 formed on the substrate 101 to become an anode electrode, a partition wall 107 formed on the first electrode 103 and having openings corresponding to pixels, a plurality of red R, green G and blue B organic light emitting layers 113a, 113b and 113c formed in the openings 107a of the partition wall 107, and a second electrode 115 formed on each of the organic light emitting layers 113a, 113b and 113c to become a cathode electrode.

Here, the partition wall 107 may improve brightness by blocking light leaked through a space between neighboring pixels, and cover (shield) color filters or organic light emitting layers during a fabrication process.

Also, the partition wall 107 may have a thickness thinner than the thickness of each organic light emitting layer 113a, 113b and 113c.

The partition wall 107 may not be formed by the expose and development processes using the existing photolithography, but be formed by representing an area, which defines a portion of each organic light emitting layer implementing each color, on the surface of the substrate 101 by using a material belonging to an amine group through pen-like device (not shown).

Also, a material belonging to a hydrophilic amine group may be used to form the partition wall 107.

Figure 6A:
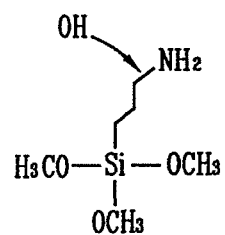
Figure 6B:
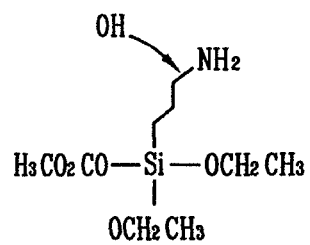

Types of the materials belonging to the hydrophilic amine group may include 3-aminepropyltrimethoxysilane as shown in FIG. 6a or 3-aminopropyltriethoxysilane as shown in FIG. 6b.

Figure 7:
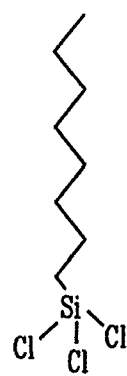
FIG. 7 is an exemplary chemical formula of a material which forms an organic light emitting layer of the organic light emitting diode display device according to the present disclosure.

In addition, each of R, G and B organic light emitting layers 113a, 113b and 113c may be formed of a material, such as a hydrophobic octadecyl-trichlorosilane (OTS) as shown in FIG. 7.

In the configuration, when a driving voltage is applied to the first and second electrodes 103 and 115 of the organic light emitting diode display device according to the present invention, a hole injected from the first electrode 103, to which an anode voltage is applied, is moved toward each of the organic light emitting layers 113a, 113b and 113c via a hole transfer layer (not shown), while an electron is injected into each of the organic light emitting layers 113a, 113b and 113c from the second electrodes 115, to which a cathode voltage is applied, via an electron transfer layer (not shown).

Here, the electron and the hole are recombined at the organic light emitting layers 113a, 113b and 113c to generate exciton. As the exciton is changed from an excited state into a ground state, fluorescent molecules of the organic light emitting layers 113a, 113b and 113c emit light to thusly define an image.

A fabrication method of the organic light emitting diode display device according to the present disclosure having such configuration will be described with reference to FIGS. 5a to 5d.

FIGS. 5a to 5d are cross-sectional views showing fabrication processes of an organic light emitting diode display device according to the present disclosure.

Figure 5A:
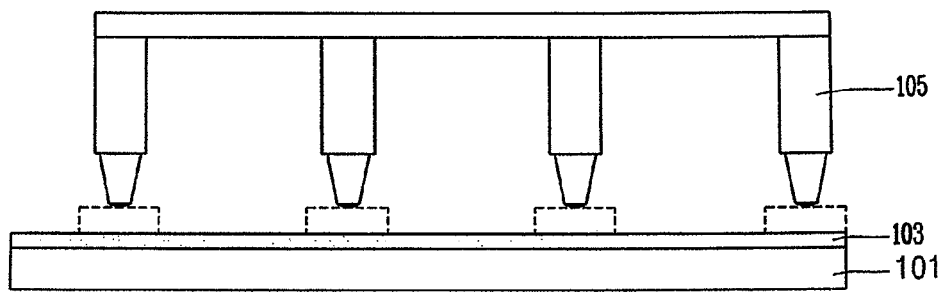
FIGS. 5a to 5d are cross-sectional view showing fabrication processes of the organic light emitting diode display device according to the present disclosure.

As shown in FIG. 5a, a conductive material, which is used to form either an anode electrode or a cathode electrode as a first electrode 103, is deposited on a transparent substrate 101 to form the first electrode 103 of the display device.

A reflective plate (not shown) may be formed on every pixel region of the substrate 101 at a lower portion of the conductive layer to prevent light from being leaked onto the substrate 101.

The first electrode 103 may be formed as an anode electrode or a cathode electrode. If the first electrode 103 is an anode electrode, the first electrode 103 may have a structure in which a reflective plate and an indium tin oxide (ITO) layer are sequentially stacked or a structure in which a reflective plate and an indium zinc oxide (IZO) layer are sequentially stacked. Also, the conductive layer may have a single-layered structure formed of at least one material selected from a group including nickel Ni, platinum Pt, aurum Au, iridium Ir, chrome Cr and oxide thereof.

In the contrary, if the first electrode 103 is a cathode electrode, the first electrode 103 may be formed of magnesium Mg, calcium Ca, aluminum Al, argentum Ag, barium Ba or alloys thereof to be sufficiently thick such that it can reflect light.

Here, description will be made of the case where the first electrode 103 is the anode electrode.

Figure 5B:
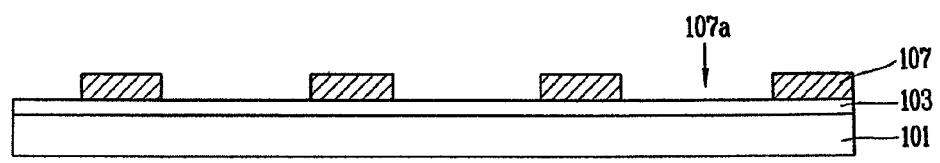

As shown in FIG. 5b, a material belonging to an amine group is surface-treated on the first electrode 103 formed on the substrate 101 using pen-like devices (refer to 105 of FIG. 5a) to form a partition wall 107 which designates areas where the organic light emitting layers are formed, respectively.

Here, a material belonging to a hydrophilic amine group may be used to form the partition wall 107.

Types of the materials belonging to the hydrophilic amine group may include 3-aminepropyltrimethoxysilane as shown in FIG. 6a or 3-aminopropyltriethoxysilane as shown in FIG. 6b.

Here, the partition wall 107 may improve brightness by blocking light leaked through a space between neighboring pixels, and cover (shield) color filters or organic light emitting layers during a fabrication process.

In the meantime, the process of forming the partition wall 107 using the surface treatment may also be applied to form direct patterns, such as other organic thin films, sol-gel material, nano-material, or the like.

Figure 5C:
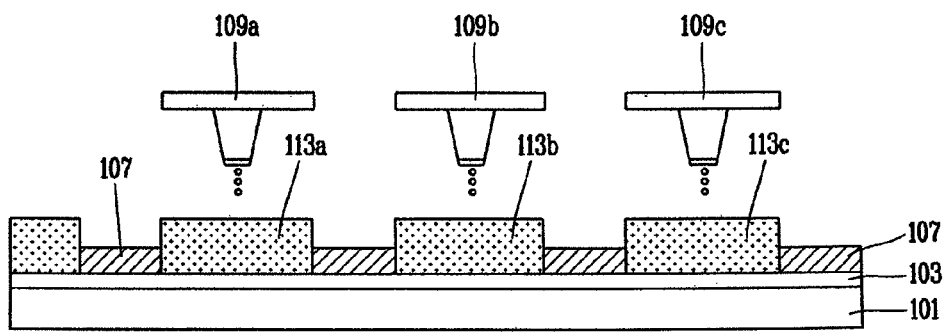

The partition wall 107 may have a thickness thinner than that of each organic light emitting layer (refer to 113a, 113b and 113c of FIG. 5c).

As shown in FIG. 5c, R, G and B organic light emitting solutions are sequentially dispensed into a plurality of openings 107a formed in the partition wall 107 by adapting an inkjet printing method by means of inkjet dispensing units 109a, 109b and 109c, so as to form R, G and B organic light emitting layers 113a, 113b and 113c, respectively.

Here, the inkjet dispensing units 109a, 109b and 109c may be used simultaneously or sequentially. That is, orders are not required to dispense the R, G and B organic light emitting solutions, which means that any solution can be dropped first.

In addition, each of the R, G and B organic light emitting layers 113a, 113b and 113c may be formed of a material, such as a hydrophobic octadecyl-trichlorosilane (OTS) as shown in FIG. 7.

Each of the R, G and B organic light emitting layers 113a, 113b and 113c may be formed to be thicker than the partition wall 107.

As such, even if the R, G and B organic light emitting layers 113a, 113b and 113c are formed to be thicker than the partition wall 107, a problem in that the organic light emitting solution runs onto the partition wall 107 to be spread out on to a neighboring organic light emitting layer, may not occur.

Here, the amine group used for the partition wall 107 may relatively be hydrophilic, the amine group used for the organic light emitting layers may be hydrophobic.

Therefore, the hydrophilic material attracts the hydrophilic material and pushes out the hydrophobic material because of hydrophilicity and hydrophobicity of materials. Accordingly, the problem, in which the hydrophobic organic light emitting solution which runs onto the partition wall may be spread onto a neighboring organic light emitting layer, will be avoided.

Meanwhile, any material, which can be processed by solution, such as a quantum dot solution in which a quantum dot (CdSe, CdTe, InP, etc.), as a semi-conducting material with an energy band gap at a visible ray area, is processed by a hydrophobic solution, a light emitting solution in which a low molecular material is dispersed in an organic solvent, a dendrimer or the like, may be used as a light emitting material forming the organic light emitting layer.

Figure 5D:
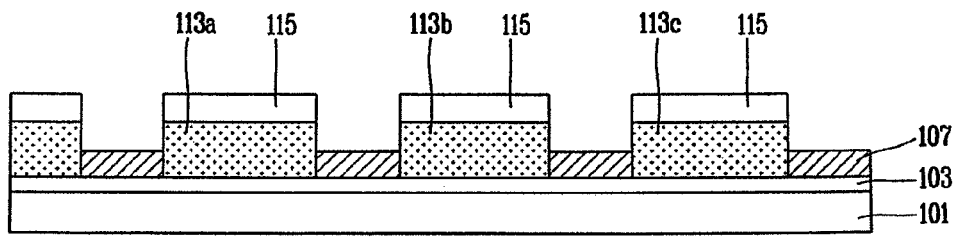

As shown in FIG. 5d, after the formation of the R, G and B organic light emitting layers 113a, 113b and 113c, a metallic material is deposited on each of the organic light emitting layers 113a, 113b and 113c to be then patterned. Accordingly, second electrodes 115 with respect to the first electrode 103 are formed, so as to complete the fabrication of the organic light emitting diode display device.

Here, the second electrode 115 may usually be used either as a cathode electrode or as an anode electrode of the organic light emitting diode display device. Description will be made hereafter of the case where the second electrode 115 is used as the cathode electrode.

Also, in another embodiment of the present disclosure, the material belonging to the amine group may form the partition wall and the OTS may form the selective pattern areas, namely, the organic light emitting layer areas, or vice versa.

As described above, the organic light emitting diode display device and the fabrication method thereof according to the present disclosure will have the following effects.

In the organic light emitting diode display device and the fabrication method thereof, the amine group is used to form the partition wall surface-treated by the pen-like devices, and thereafter the hydrophobic OTS is used to selectively form the organic light emitting layers.

Therefore, the surface treatment technique can allow a selective self-aligned patterning so as to allow a direct patterning without degradation of color impurity.

Thus, organic light emitting layer solution can be prevented from spreading out by the selective surface treatment, to thereby avoid color mixing and degradation of color impurity at boundaries of the R, G and B organic light emitting layers.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An organic light emitting diode display device comprising:
   a first electrode formed on a substrate;
   a reflective plate at a low portion of the first electrode to prevent light from being leaked onto the substrate, wherein the reflective plate is formed on every pixel region of the substrate;
   a partition wall having hydrophilicity and formed on the first electrode, the partition wall having a plurality of openings, wherein the partition wall is formed by a surface treatment using a material belonging to an amine group through pen like device, and the material belonging to the amine group is one of 3-aminopropyltrimethoxysilane and 3-aminopropyl-triethoxysilane;
   red, green and blue organic light emitting layers having hydrophobicity and formed on the plurality of openings of the partition wall, respectively, wherein each of the red, green and blue organic light emitting layers is formed to be thicker than the partition wall, wherein the partition wall having hydrophilicity attracts a material having hydrophilicity and pushes out a material having hydrophobicity so that the organic light emitting layers run onto the partition wall are not spread onto a neighboring organic light emitting layer; and
   a second electrode formed on each of the hydrophobic red, green and blue organic light emitting layers.

2. The device of claim 1, wherein the first electrode is an anode electrode, and the second electrode is a cathode electrode.

3. The device of claim 1, wherein the first electrode comprises a material having high reflexibility including chrome, aluminum, argentums or alloy thereof.

4. The device of claim 1, wherein the hydrophobic red, green and blue organic light emitting layers is hydrophobic octadecyl-trichlorosilane (OTS).

5. The device of claim 1, wherein the hydrophobic red, green and blue organic light emitting layers are formed by using a quantum dot solution in which a quantum dot (CdSe, CdTe, InP, etc.), as a semi-conducting material with an energy band gap at a visible ray area, is treated by a hydrophobic solution, a light emitting solution in which a low molecular material is dispersed in an organic solvent, or a dendrimer.

6. A method for fabricating an organic light emitting diode display device comprising:
   forming a first electrode on a substrate;
   forming a reflective plate at a low portion of the first electrode to prevent light from being leaked onto the substrate, wherein the reflective plate is formed on every pixel region of the substrate;
   forming a hydrophilic partition wall having a plurality of openings on the first electrode by a selective surface treatment using a material belonging to an amine group through pen like device, and the material belonging to the amine group is one of 3-aminopropyltrimethoxysilane and 3-aminopropyl- triethoxysilane;
   forming hydrophobic red, green and blue organic light emitting layers on the plurality of openings of the partition wall, respectively, wherein each of the hydrophobic red, green and blue organic light emitting layers is formed to be thicker than the partition wall, wherein the hydrophilic partition wall attracts a hydrophilic material and pushes out a hydrophobic material so that the organic light emitting layers run onto the hydrophilic partition wall are not spread onto a neighboring hydrophobic organic light emitting layer; and
   forming a second electrode on each of the hydrophobic red, green and blue organic light emitting layers.

7. The method of claim 6, wherein the first electrode is an anode electrode, and the second electrode is a cathode electrode.

8. The method of claim 6, wherein the first electrode is formed of a material having high reflexibility including chrome, aluminum, argentums or alloy thereof.

9. The method of claim 6, wherein the material of the hydrophobic red, green and blue organic light emitting layers is hydrophobic octadecyl-trichlorosilane (OTS).

10. The method of claim 6, wherein the hydrophobic red, green and blue organic light emitting layers are formed by using a quantum dot solution in which a quantum dot (CdSe, CdTe, InP, etc.), as a semi-conducting material with an energy band gap at a visible ray area, is treated by a hydrophobic solution, a light emitting solution in which a low molecular material is dispersed in an organic solvent, or a dendrimer.

* * * * *